United States Patent
Zhou et al.

(10) Patent No.: US 7,773,695 B2
(45) Date of Patent: Aug. 10, 2010

(54) AMPLITUDE MODULATOR

(75) Inventors: Liming Zhou, Lake Hiawatha, NJ (US); Vadim Kikin, Spring Valley, NY (US)

(73) Assignee: Dominic Kotab, San Jose, CA (US)

( * ) Notice: Subject to any disclaimer, the term of this patent is extended or adjusted under 35 U.S.C. 154(b) by 1283 days.

(21) Appl. No.: 11/207,348

(22) Filed: Aug. 19, 2005

(65) Prior Publication Data

US 2007/0040606 A1    Feb. 22, 2007

(51) Int. Cl.
*H03C 1/52* (2006.01)
(52) U.S. Cl. .................... 375/300; 375/298
(58) Field of Classification Search ......... 375/295–298, 375/300, 308, 329, 330, 331–332
See application file for complete search history.

(56) References Cited

U.S. PATENT DOCUMENTS

| | | | |
|---|---|---|---|
| 3,896,395 A | 7/1975 | Cox | 330/53 |
| 4,178,557 A | 12/1979 | Henry | 330/10 |
| 4,574,248 A | 3/1986 | Snodgrass | 330/2 |
| 5,105,164 A | 4/1992 | Fisher et al. | 330/149 |
| 5,249,201 A | 9/1993 | Posner et al. | 375/59 |
| 5,321,543 A * | 6/1994 | Huber | 398/194 |
| 5,365,187 A | 11/1994 | Hornak et al. | 330/10 |
| 5,742,201 A | 4/1998 | Eisenberg et al. | 330/2 |
| 5,818,298 A | 10/1998 | Dent et al. | 335/10 |
| 5,886,573 A | 3/1999 | Kolanek | 350/10 |
| 6,043,707 A | 3/2000 | Budnik | 330/10 |
| 6,147,553 A | 11/2000 | Kolanek | 330/10 |
| 6,275,685 B1 | 8/2001 | Wessel et al. | 455/126 |
| RE37,407 E | 10/2001 | Eisenberg et al. | 330/2 |
| 6,313,703 B1 | 11/2001 | Wright et al. | 330/149 |
| 6,396,341 B1 | 5/2002 | Pehlke | 330/10 |
| 6,472,934 B1 | 10/2002 | Pehlke | 330/10 |
| 6,567,436 B1 * | 5/2003 | Yao et al. | 372/32 |
| 6,583,910 B1 * | 6/2003 | Satoh | 398/182 |
| 6,639,509 B1 * | 10/2003 | Martinez | 340/10.4 |
| 6,751,265 B1 * | 6/2004 | Schell et al. | 375/269 |
| 6,819,174 B2 | 11/2004 | Yamakawa et al. | 330/151 |
| 6,825,719 B1 * | 11/2004 | Barak et al. | 330/129 |
| 6,853,244 B2 | 2/2005 | Robinson et al. | 330/51 |
| 2003/0045264 A1 * | 3/2003 | Jeong et al. | 455/323 |
| 2003/0189744 A1 * | 10/2003 | Prosyk | 359/237 |
| 2003/0194240 A1 * | 10/2003 | Mollenauer et al. | 398/158 |
| 2003/0223462 A1 * | 12/2003 | Fu et al. | 370/500 |

(Continued)

OTHER PUBLICATIONS

PCT Preliminary Report from PCT application No. PCT/US2006/029629 mailed on Feb. 28, 2008.

(Continued)

*Primary Examiner*—Emmanuel Bayard
(74) *Attorney, Agent, or Firm*—Zilka-Kotab, PC

(57) ABSTRACT

A circuit for amplitude modulating a carrier signal includes a carrier signal input, circuitry for splitting the carrier signal into first and second paths, circuitry for phase modulating the carrier signal on the first path, circuitry for phase modulating the carrier signal on the second path, and circuitry for combining the phase modulated carrier signal on the first path with the phase modulated carrier signal on the second path for generating an amplitude modulated output signal. Feedback loops virtually eliminate residual phase shift and make the amplitude modulated output signal linearly proportional to the baseband signal.

25 Claims, 2 Drawing Sheets

U.S. PATENT DOCUMENTS

| | | | |
|---|---|---|---|
| 2004/0028146 A1* | 2/2004 | Winkler | 375/260 |
| 2004/0263246 A1* | 12/2004 | Robinson et al. | 330/124 R |
| 2004/0266368 A1* | 12/2004 | Rosnell | 455/110 |
| 2005/0117191 A1* | 6/2005 | Griffin | 359/245 |
| 2005/0136864 A1* | 6/2005 | Zipper | 455/127.1 |
| 2006/0083144 A1* | 4/2006 | Piede et al. | 369/100 |
| 2007/0122161 A1* | 5/2007 | Charlet et al. | 398/188 |

OTHER PUBLICATIONS

PCT Search Report and Written Opinion from related PCT application No. PCT/US2006/029629 mailed on Mar. 28, 2007.

* cited by examiner

AMPLITUDE MODULATOR

FIELD OF THE INVENTION

The present invention relates to Radio Frequency (RF) signal processing circuitry, and more particularly, this invention relates to an energy efficient amplitude modulator exhibiting low phase noise and low residual phase shift.

BACKGROUND OF THE INVENTION

Wireless communication systems have become increasingly popular. These applications, however, pose two special problems. First, the Radio Frequency (RF) carrier modulation by which information is transmitted must demand the smallest bandwidth possible due to the general shortage of available spectrum. As a result, both the amplitude and the phase (i.e., frequency) of the carrier must be precisely controlled during modulation. Amplifying the modulated carrier without excessive distortion in the transmitter output stage imposes significant linearity constraints on the output stage amplifier.

Second, the power efficiency of the transmitter is very important where the transmitting end of the wireless link is battery powered. Typically, the transmitter output stage is the largest power consumer; hence, improvements in this stage are the most important. Class A RF amplifiers provide a distortion-free output, but require large amounts of power. Non-linear amplifiers, including class B and class C amplifiers, provide higher RF output power and better efficiency. One of the most efficient RF power amplifiers is the class C RF amplifier in which the output transistor conducts current only at the time when the collector-emitter voltage is at its lowest value. Unfortunately, these amplifiers are very nonlinear and introduce substantial amplitude distortion. Because of this distortion, class C amplifiers are used mainly in FM transmitters in which the amplitude or "envelope" of the RF carrier is constant, and hence, such distortion has no effect on the output spectrum occupancy.

Technologies such as Radio Frequency Identification (RFID) use amplitude modulated signals.

As shown in FIG. 1, an RFID system 100 includes RFID tags 102, a reader 104, and an optional backend system, e.g., server 106. Each tag 102 includes an IC chip and an antenna. The IC chip includes a digital decoder needed to execute the computer commands that the tag 102 receives from the tag reader 104. In some tags 102, the IC chip also includes a power supply circuit to extract and regulate power from the RF reader; a detector to decode signals from the reader; a backscatter modulator, a transmitter to send data back to the reader; anti-collision protocol circuits; and at least enough memory to store its EPC code.

Communication begins with a reader 104 sending out signals to find the tag 102. When the radio wave hits the tag 102 and the tag 102 recognizes and responds to the reader's signal, the reader 104 decodes the data programmed into the tag 102 and sent back in the tag reply. The information can then be passed to the optional server 106 for processing, storage, and/or propagation to another computing device. By tagging a variety of items, information about the nature and location of goods can be known instantly and automatically.

Many RFID systems use reflected or "backscattered" radio frequency (RF) waves to transmit information from the tag 102 to the reader 104. Since passive (Class-1 and Class-2) tags get all of their power from the reader signal, the tags are only powered when in the beam of the reader 104. Class-3 and higher tags often include an on-board power source, e.g., a battery.

Because the tag reader is usually hardwired to a power source (e.g., power outlet), power efficiency is not generally a concern. Thus, class A amplifiers are typically used. However, as RFID becomes prominent as the tracking and identification system of choice, new RFID applications will be required. One of the most important of these is portable tag reader. As with any portable device, second only to reliability in importance is power consumption. However, the distortion inherent in non-linear amplifiers has been a barrier to use of class B and class C amplifiers in portable RFID transmitters.

To reduce the power requirements of portable RF transmitters such as portable RFID readers, it would be desirable to obtain the low power benefits of class C amplifiers with a clean, undistorted output.

SUMMARY OF THE INVENTION

To provide the aforementioned desirable benefits, a circuit for amplitude modulating a carrier signal includes a carrier signal input, circuitry for splitting the carrier signal into first and second paths, circuitry for phase modulating the carrier signal on the first path, circuitry for phase modulating the carrier signal on the second path, and circuitry for combining the phase modulated carrier signal on the first path with the phase modulated carrier signal on the second path for generating an amplitude modulated output signal.

Preferably, the carrier signals on the first and second paths are constant-envelope phase modulated. This allows energy efficient nonlinear amplifiers to be used on the first and second paths.

To reduce a residual phase variation of the amplitude modulated output signal, a first feedback loop couples the amplitude modulated output signal to the circuitry for phase modulating the carrier signal on the second path. The first feedback loop is coupled to the carrier signal input, where the first feedback loop locks the phase of the amplitude modulated output signal to the carrier signal.

A baseband signal input introduces a baseband signal, which in turn affects the circuitry for phase modulating the carrier signal on the first path. Linearizing circuitry makes an envelope amplitude of the amplitude modulated output signal linearly proportional to an amplitude of the baseband input signal. The output of the linearizing circuitry affects the circuitry for phase modulating the carrier signal on the first path. Preferably, the linearizing circuitry includes a second feedback loop coupled to an output of the amplitude modulated output signal. Also preferably, the linearizing circuitry includes a difference amplifier receiving the baseband signal and a signal from the second feedback loop.

The circuit described herein or portions thereof can be implemented in any device, and is particularly useful in devices having a Class A amplifier, Class AB amplifier, Class B amplifier, Class C amplifier, Class D amplifier, Class E amplifier, Class F amplifier, etc.

System implementations are also presented, including RFID systems. RFID systems typically include a plurality of RFID tags and an RFID interrogator in communication with the RFID tags.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

Figure 1:
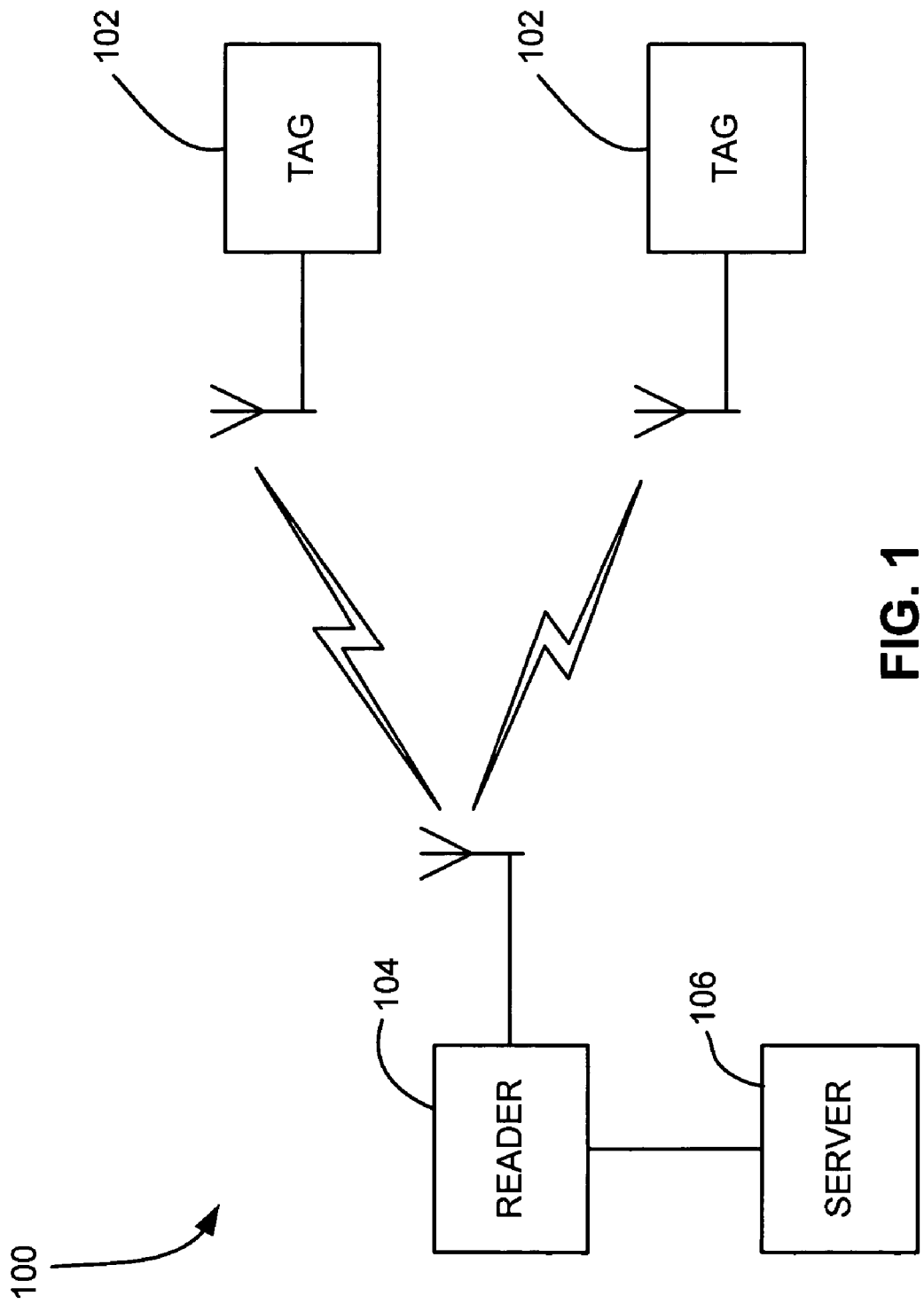
FIG. 1 is a system diagram of an RFID system.

The following description is the best mode presently contemplated for carrying out the present invention. This description is made for the purpose of illustrating the general principles of the present invention and is not meant to limit the inventive concepts claimed herein. Further, particular features described herein can be used in combination with other described features in each and any of the various possible combinations and permutations.

In the drawings, like and equivalent elements are numbered the same throughout the various figures.

The following specification describes a nonlinear amplifier driven, low phase noise amplitude modulator with virtually no residual phase shift. The amplitude modulator is particularly adapted to implementation in or as a class C operated device which exhibits low power consumption but does not exhibit the distortion traditionally found in class C devices.

Many types of devices can take advantage of the embodiments disclosed herein, including but not limited to Radio Frequency Identification (RFID) systems (all Classes) and other wireless devices/systems; portable electronic devices such as portable telephones and other audio/video communications devices; and virtually any type of electronic device where amplitude modulation is utilized. To provide a context, and to aid in understanding the embodiments of the invention, much of the present description shall be presented in terms of an RFID system such as that shown in FIG. 1. It should be kept in mind that this is done by way of example only, and the invention is not to be limited to RFID systems, as one skilled in the art will appreciate how to implement the teachings herein into electronics devices in hardware and/or software. Examples of hardware include Application Specific Integrated Circuits (ASICs), printed circuits, monolithic circuits, reconfigurable hardware such as Field Programmable Gate Arrays (FPGAs), etc.

Figure 2:
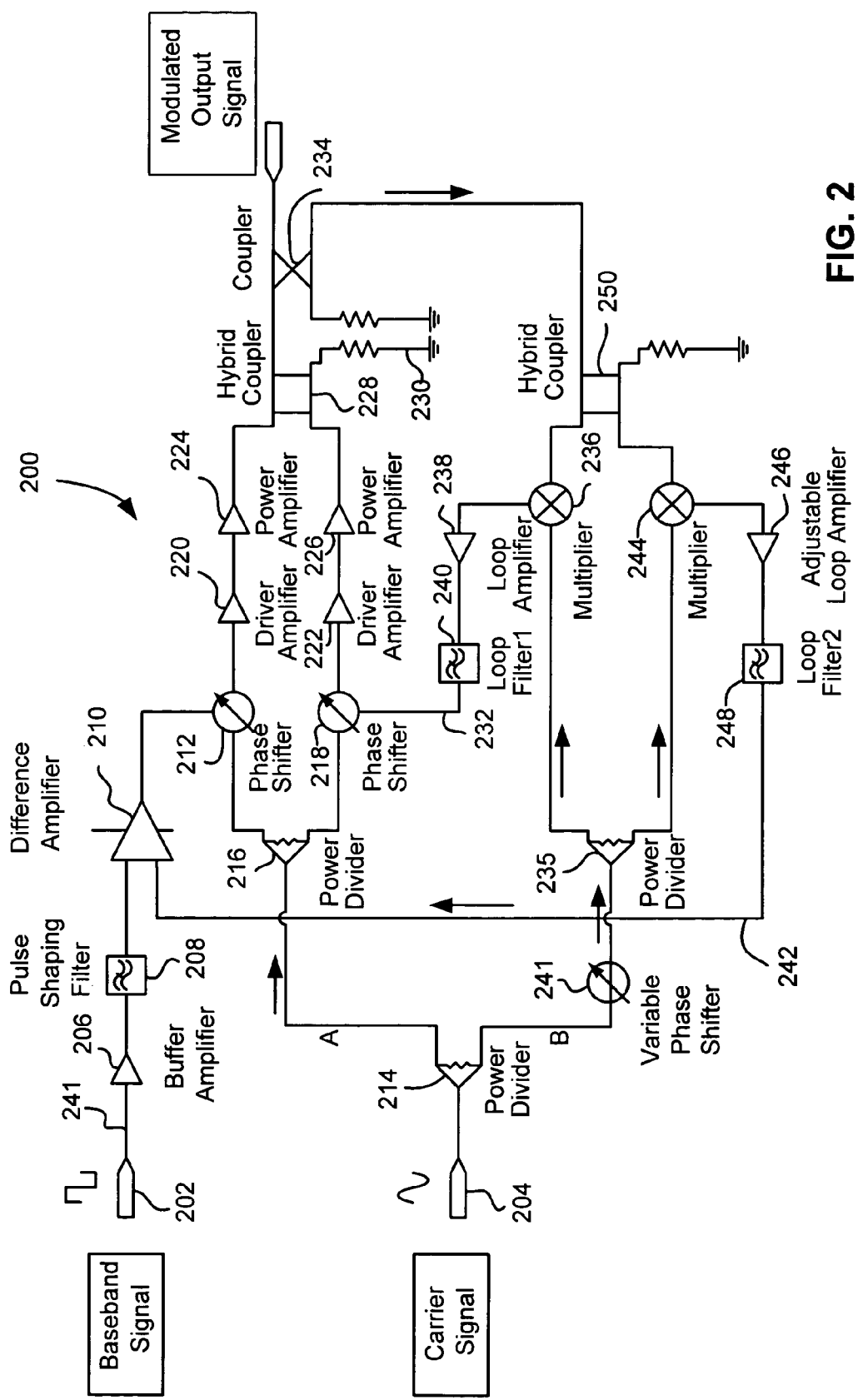
FIG. 2 is a circuit diagram of an amplitude modulator according to one embodiment.

FIG. 2 illustrates a preferred embodiment 200 of the present invention. The circuit 200 shown in FIG. 2 provides a new way to amplify and modulate the carrier signal in an AM RF transmitter.

With continued reference to FIG. 2, a baseband signal is introduced at input 202 and an RF carrier signal is introduced at input 204. The carrier signal is split by a conventional power divider 214 into paths A and B. Following path A, the carrier signal is again divided into two paths by a second power divider 216 and then passed to a first phase shifter 212 and a second phase shifter 218. The phase shifters change the phase of the signals going into power amplifiers 224, 226 and optional driver amplifiers 220, 222.

The gain of the power amplifiers 224, 226 is controlled by individual control signals to ensure no excessive energy is wasted. Each power amplifier 224, 226 also receives a phase modulated input signal that is at a constant envelope, which allows the designer to use energy efficient nonlinear amplifiers without inducing excessive noise. If the signal input to the power amplifier were not constant (as in the case where the input signals were already modulated), then the amplifier would be dynamically adjusting its bias condition based on the input signal amplitude, with the result that the amplified signal would occupy a very wide frequency band (if nonlinear amplifiers are used). The wider frequency band includes more noise to the nearby radio frequency operated equipment.

Amplitude modulation is achieved by combining the two amplified and phase modulated signals using a first combiner 228, which in the exemplary embodiment shown is a hybrid coupler. One exemplary combiner is a 3 dB 90° coupler.

When the amplified signals from the phase shifters 212, 218 are combined, the combined signal will vary from optimum when the phases are aligned, to a point where the signals might cancel portions of each other out when the phases are misaligned by 180 degrees. In an ideal situation, the phases of the two signals are shifted in the opposite direction on a phase plane, equal in variation of angles. The in-phase sum of the two signals becomes the desired output, while the quadature sum becomes unwanted and goes into a dump 230 at the first combiner 228. If the two phase shifters does not provide the same amount of phase shift, a residual phase shift is then created with the output signal.

The total power output of the AM modulated output signal can be precisely controlled by adjusting the amplifiers 220, 222, 224, 226 and/or buffer amplifier 208, so the spectrum of the AM modulated output signal can be made very sharp, in other words, made to occupy a very small spectrum. This enables, for example, RFID devices to function in a dense reader environment, where each reader may use a different spectrum for communications with tags. This also allows RFID devices to operate in jurisdictions where regulations only allow communications in a small bandwidth. An additional benefit of being able to use nonlinear amplifiers with adjustable gain to control the level of the AM modulated signal output is that energy is conserved. Note that if energy conservation is not a concern, linear amplifiers could be used.

Further, by allowing precise control of the amplitude and phase of the modulated signal, the pulse can be shaped to occupy a very narrow frequency band. An additional benefit is that by using two power amplifiers, each amplifier provides a constant power for each signal branch.

The portion of the circuit described above is able to perform the modulation, but is not perfect. Accordingly, additional components are provided to further enhance the signal.

To lock the phase of the AM modulated output to the carrier signal, a first feedback loop 232 acts as a phase lock loop by extracting a portion of the AM modulated output signal at coupler 234, combining it with the carrier input signal, and directing that back to the second phase shifter 218. This has the effect of locking the AM modulated signal to the carrier input signal, thereby eliminating any residual phase variation (phase noise) in the AM modulated output signal. Accordingly, the phase change is used to create an AM modulated output which has virtually no phase noise.

The carrier signal is the reference signal for the first feedback loop 232. As shown, the carrier signal follows path B and is split into two paths by a power divider 235. A mixer/multiplier 236 combines the extracted AM modulated signal with the carrier input signal. The carrier signal is compared to the AM modulated output to see if there is any phase difference between the two. Upon mixing the signals, a baseband signal is generated, which has a lower frequency compared to the carrier signal, but a similar or slightly higher frequency range than the AM modulated output. In other words, the frequency of the baseband signal is less than the frequency of the carrier signal, the carrier signal sometimes being referred to as the local oscillator signal. The baseband signal sets the modulator frequency.

There is something critical about the phase shift. The AM output signal at best will have no residual phase shift. Ideally, its phase would follow the phase of a sine wave. If the phase loosens up during modulation, it will occupy a larger bandwidth. Essentially, the multiplier 236 acts as a phase detector that identifies the difference between the AM modulated output and the reference signal (carrier).

The output signal from the mixer/multiplier 236 continues on the first feedback loop 232, where a loop amplifier 238 amplifies the signal, and a low pass filter 240 removes high frequency noise from the signal and stabilize the loop. The amplified and filtered signal is applied to the second phase shifter 218, thereby controlling operation of the second phase shifter 218.

Accordingly, the first feedback loop 232 automatically controls the second phase shifter 218, with the result that the modulated signal at the output will have about the same phase as the input RF carrier signal. Thus, residual phase shift is essentially removed. A variable delay line/phase shifter 241 is placed on Path B before power divider 235 to ensure the stability of the system for a broad RF operating frequency band.

Referring now to the baseband signal input line 241 and the second feedback loop 242, it is seen that the baseband signal affects the first phase shifter 212, changing the phase of the signals passing through the first phase shifter 212 by up to 180 degrees. The baseband signal is coupled through a conventional buffer amplifier 206. A conventional pulse (spectrum) shaping filter 208 provides a shaped input signal to a difference amplifier 210. The difference amplifier 210, in turn generates a control signal for controlling the first phase shifter 212.

In order to have a narrow AM output spectrum, an RF carrier signal is preferably modulated with a frequency limited baseband signal. However, a digital signal like the baseband signal occupies a large frequency band. This signal needs to be shaped. Merely placing a filter on the baseband input line will not significantly limit the bandwidth of the baseband signal. Rather, some linearization is preferred.

A problem solved by the embodiment shown is that the amplitude of the carrier signal does not otherwise follow linearly to the phase shifter control voltage. The non-linearity comes from two aspects. One is from the control voltage-phase shift relationship of a reflective phase shifter, and the other is from the trigonometric combining of two RF signals. Assume a 1V phase shifter control signal applied to the first phase shifter creates a 10% shift. A 2V control input results in a 15% shift, and so on. This nonlinearity must be compensated for to obtain a clean AM output signal. The second feedback loop 242 corrects the amplitude response to the phase shifter control voltage. In other words, the phase shifter control voltage is made linearly proportional to the amplitude of the AM modulated output signal.

Referring now to operation of the second feedback loop 242, the carrier signal follows path B, where a mixer/multiplier 244 combines the extracted AM modulated signal with the carrier input signal. This mixer/multiplier also acts as the RF amplitude detector. The combined signal continues on the second feedback loop 242, where an adjustable loop amplifier 246 amplifies the signal, and a low pass filter 248 filters the signal. The functions of the amplifier 246 and filter 248 are similar to those of the filter 240 and amplifier 238 of the first feedback loop 232. The amplifier 246 is this case makes the feedback signal stronger so it becomes comparable to the baseband control signal. Usually the baseband control signal is a 0 or 1 digitally, indicated by high and low signals or by length of high signal, length of low signal, etc. Typical high and low voltages are 1 V and 4V, 0.5 V and 3V, etc. The adjustable nature of the amplifier 246 allows the feedback signal (amplitude detector output) to be in about the same range as the baseband signal at the difference amplifier 210.

The amplified and filtered signal is directed to the difference amplifier 210, which may be an operation amplifier. The difference amplifier 210 develops a control signal by comparison of the shaped baseband signal and the envelope of the AM modulated output signal (amplitude detector signal) from the second feedback loop 242. Any difference becomes the error signal output of the difference amplifier 210, which is used to control the first phase shifter 212.

The second feedback loop 242 acts as a linearization loop that directs some of the AM modulated output back to the difference amplifier 210 at the baseband signal input line 241. This feedback scheme makes the envelope amplitude of the AM modulated output signal linearly proportional to the amplitude of the baseband input signal by compensating for the non-linearity of the phase shifter response and phase modulation to amplitude modulation conversion. The second feedback loop 242 may be either analog or digital.

In a preferred embodiment, the phase of the first feedback loop 232 is locked, and the second feedback loop 242 has a 90 degree phase shift from the first feedback loop 232. The power divider 235, multipliers 236 and 244, and hybrid coupler 250 form a quadature downconverter. All variations of quadature downconverters may be used here to detect the amplitude and phase of the modulated output.

One skilled in the art will appreciate that some or all of the power dividers, combiners, couplers, multipliers, etc. shown can be replaced by circuitry providing equivalent functionality, and so the present invention is not to be limited to the embodiment show in FIG. 2. For instance, rather than detecting the envelope of the AM modulated output signal using the mixer/multiplier 244, a diode or rectifier can be used. In another variation, any form of power combiner, including transformer, hybrid coupler, in-phase combiner and out-of-phase combiner, can be used to replace the power divider 216, power divider 235, hybrid coupler 228 and/or hybrid coupler 250.

There has thus been described a circuit that performs well as an amplitude modulator. The inputs to the power amplifiers are at a constant amplitude, allowing use of energy efficient nonlinear amplifiers.

Additionally, there is no residual output phase drifting compared to the carrier signal due to the presence and effect of the first feedback loop 232.

The second feedback loop 242 ensures that the amplitude of the AM output signal is linearly proportional to the baseband signal voltage. This in turn allows use of a simple filter in the baseband signal input line to define the spectrum.

Again, it should be stressed that the teachings herein can be applied to other types of circuits, including those having more or fewer components, different functionality, different components performing the same function, etc.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A circuit for amplitude modulating a carrier signal, comprising:
   a carrier signal input;
   circuitry for splitting the carrier signal into first and second paths;
   circuitry for phase modulating the carrier signal on the first path;
   circuitry for phase modulating the carrier signal on the second path;
   circuitry for combining the phase modulated carrier signal on the first path with the phase modulated carrier signal on the second path for generating an amplitude modulated output signal; and
   a first feedback loop coupling the amplitude modulated output signal to the circuitry for phase modulating the carrier signal on the second path but not to the circuitry for phase modulating the carrier signal on the first path, the first feedback loop being for reducing a residual phase variation of the amplitude modulated output signal.

2. A circuit as recited in claim 1, wherein the carrier signals on the first and second paths are constant-envelope phase modulated.

3. A circuit as recited in claim 2, further comprising a first amplifier on the first path and a second amplifier on the second path, wherein the first and second amplifiers are nonlinear amplifiers.

4. A circuit as recited in claim 1, wherein the first feedback loop controls a phase shifter of the circuitry for phase modulating the carrier signal on the second path.

5. A circuit as recited in claim 1, wherein the first feedback loop is coupled to the carrier signal input, wherein the first feedback loop locks the phase of the amplitude modulated output signal to the carrier signal.

6. A circuit as recited in claim 1, further comprising a baseband signal input, wherein the baseband signal affects the circuitry for phase modulating the carrier signal on the first path.

7. A circuit as recited in claim 6, further comprising linearizing circuitry for making an envelope amplitude of the amplitude modulated output signal linearly proportional to an amplitude of the baseband input signal, an output of the linearizing circuitry affecting the circuitry for phase modulating the carrier signal on the first path.

8. A circuit as recited in claim 7, wherein the linearizing circuitry includes a second feedback loop coupled to an output of the amplitude modulated output signal.

9. A circuit as recited in claim 8, wherein the linearizing circuitry includes a difference amplifier receiving the baseband signal as one input and a signal from the second feedback loop as another input.

10. A circuit as recited in claim 1, wherein the circuit is implemented in a Class C device.

11. A Radio Frequency Identification (RFID) system, comprising:
    a plurality of RFID tags; and
    an RFID interrogator in communication with the RFID tags, the RFID interrogator having the circuit of claim 1.

12. A method for amplitude modulating a carrier signal, comprising:
    splitting a carrier signal into first and second paths;
    phase modulating the carrier signal on the first path;
    receiving a baseband signal that is not derived from the carrier signal, wherein the baseband signal affects the circuitry for phase modulating the carrier signal on the first path;
    phase modulating the carrier signal on the second path; and
    combining the phase modulated carrier signal on the first path with the phase modulated carrier signal on the second path for generating an amplitude modulated signal.

13. A circuit for amplitude modulating a carrier signal, comprising:
    a carrier signal input, wherein the carrier signal is an electronic signal;
    circuitry for splitting the carrier signal into first and second paths;
    circuitry for constant-envelope phase modulating the carrier signal on the first path;
    circuitry for constant-envelope phase modulating the carrier signal on the second path;
    a nonlinear amplifier on the first path for amplifying the phase modulated carrier signal on the first path;
    a nonlinear amplifier on the second path for amplifying the phase modulated carrier signal on the second path;
    circuitry for combining the amplified phase modulated carrier signal on the first path with the amplified phase modulated carrier signal on the second path for generating an amplitude modulated output signal; and
    a first feedback loop coupling the amplitude modulated output signal to the circuitry for phase modulating the carrier signal on the second path, the first feedback loop controlling a phase shifter in the circuitry for phase modulating the carrier signal on the second path.

14. A circuit as recited in claim 13, wherein the circuit is implemented in a Class C device.

15. A Radio Frequency Identification (RFID) system, comprising:
    a plurality of RFID tags; and
    an RFID interrogator in communication with the RFID tags, the RFID interrogator having the circuit of claim 13.

16. A circuit for amplitude modulating a carrier signal, comprising:
    a carrier signal input, the carrier signal being an electronic signal;
    circuitry for splitting the carrier signal into first and second paths;
    circuitry for phase modulating the carrier signal on the first path;
    circuitry for phase modulating the carrier signal on the second path;
    circuitry for combining the phase modulated carrier signal on the first path with the phase modulated carrier signal on the second path for generating an amplitude modulated output signal;
    a first feedback loop coupling the amplitude modulated output signal to the circuitry for phase modulating the carrier signal on the second path, the first feedback loop being for reducing a residual phase variation of the amplitude modulated output signal.

17. A circuit as recited in claim 16, wherein the first feedback loop is coupled to the carrier signal input, wherein the first feedback loop locks the phase of the amplitude modulated output signal to the carrier signal.

18. A circuit as recited in claim 16, wherein the circuit is implemented in a Class C device.

19. A Radio Frequency Identification (RFID) system, comprising:
    a plurality of RFID tags; and
    an RFID interrogator in communication with the RFID tags, the RFID interrogator having the circuit of claim 16.

20. A circuit for amplitude modulating a carrier signal, comprising:
- a carrier signal input;
- circuitry for splitting the carrier signal into first and second paths;
- circuitry for phase modulating the carrier signal on the first path;
- circuitry for phase modulating the carrier signal on the second path;
- circuitry for combining the phase modulated carrier signal on the first path with the phase modulated carrier signal on the second path for generating an amplitude modulated output signal;
- a baseband signal input;
- a first feedback loop coupling the amplitude modulated output signal to the circuitry for phase modulating the carrier signal on the second path, the first feedback loop being for reducing a residual phase variation of the amplitude modulated output signal;
- a second feedback loop coupled to an output of the amplitude modulated output signal; and
- linearizing circuitry coupled to the baseband signal input and second feedback loop for making an envelope amplitude of the amplitude modulated output signal linearly proportional to an amplitude of the baseband signal.

21. A circuit as recited in claim 20, wherein the linearizing circuitry includes a difference amplifier receiving the baseband signal and a signal from the second feedback loop.

22. A circuit as recited in claim 20, wherein the circuit is implemented in a Class C device.

23. A Radio Frequency Identification (RFID) system, comprising:
- a plurality of RFID tags; and
- an RFID interrogator in communication with the RFID tags, the RFID interrogator having the circuit of claim 20.

24. A method for modulating a carrier signal, comprising:
- creating from a carrier signal two sub-signals using circuitry;
- phase modulating at least one of the sub-signals relative to the other; and
- combining the sub-signals to produce a modulated carrier signal,
- wherein at least one of the sub-signals is phase modulated under control of a feedback loop having as inputs the carrier signal and the modulated carrier signal.

25. A system for modulating a carrier signal, comprising:
- circuitry for creating two electronic sub-signals from a carrier signal;
- circuitry for phase modulating at least one of the sub-signals relative to the other; and
- circuitry for combining the sub-signals to produce a modulated carrier signal,
- wherein at least one of the sub-signals is phase modulated under control of a feedback loop having as an input the modulated carrier signal.

* * * * *